May 23, 1961 J. P. MAMMOLA 2,985,709

MEANS AND METHOD OF MOUNTING ELECTRONIC COMPONENTS

Filed Aug. 6, 1957 2 Sheets-Sheet 1

INVENTOR.
JOSEPH P. MAMMOLA

BY Wade Koontz

ATTORNEY

INVENTOR.
JOSEPH. P. MAMMOLA
BY
Wade Koontz
ATTORNEY 2,985,709

MEANS AND METHOD OF MOUNTING ELECTRONIC COMPONENTS

Joseph P. Mammola, 134 Gore St., Cambridge, Mass.

Filed Aug. 6, 1957, Ser. No. 676,697
4 Claims. (Cl. 174—68.5)
(Granted under Title 35, U.S. Code (1952), sec. 266)

The invention described herein may be manufactured and used by or for the United States Government for governmental purposes without payment to me of any royalty thereon.

This invention relates to a means and method of mounting and connecting electric components to a general purpose terminal board.

In the experimental laboratory, where electric circuits are being designed and tested, it is convenient to use a terminal board rather than point-to-point wiring so that changes may be readily made or complete parts of a circuit substituted. The boards now available are flat strips of Bakelite or other insulating material with notches or holes provided into which the "pigtails" of resistors, capacitors or other components may be pressed and the terminals connected by soldering wires between them. Another similar, and preferred type, is a Bakelite or insulating strip commonly 2 to 2½ inches in width with soldering lugs riveted along each edge about half an inch apart to which the components are soldered and the lugs connected in circuit conformance by soldering wires between them. The first type is difficult to assemble and provides insecure mounting for components and is little used. The second type is more convenient and provides secure mounting for components but is bulky, hard to mount in an assembly and expensive.

In assembling finished laboratory or commercial electronic apparatus, where a specially designed printed circuit board is not justified, a general purpose mounting board is useful to speed assembly of the finished apparatus to insure uniformity and make final test and subsequent servicing quick and convenient. In finished apparatus the same objections to the usual terminal boards, as cited above, obtain and the bulk and expense of the lug type board becomes more objectionable than it is in laboratory use.

It is an object of this invention to provide an inexpensive, easy to use means and method by which electronic components may be securely mounted, which occupies a minimum of space and accommodates the maximum number of commercially available components such as resistors, capacitors, chokes and inductors, and which can be used equally well in the experimental laboratory and in final assembly of finished apparatus. Further objects of this invention are to provide flexibility of circuit design, simplified assemblies having good mechanical and electrical connections with structural strength to withstand shock and vibration, ease of visual circuit inspection and accessibility of components for "trouble shooting" or complete replacement of a group of components and miniaturization of equipment.

One form of this invention is a flat strip of insulating material, such as Bakelite, of any convenient width and thickness but commonly 2¼ inches wide by 3/32 inch thick, and in any convenient length so that it may be cut to accommodate the required components, on both sides of which is provided a grid or pattern of connecting copper filaments formed by any conventional process, but preferably by etching, and provided with holes or slots to accommodate the leads or "pigtails" of conventional commercial electronic components, such as resistors and capacitors. In use the commponents are mounted on the board by pressing the "pigtails" into the slots or holes provided, the ends being bent on the opposite side of the board to hold them in place until soldered permanently. Since all the components are electrically connected by the copper grid it is merely necessary to cut the unwanted connecting filaments to give the required circuit conformance. This can be done by using a slicing tool, such as a pen knife.

In the drawings:

Fig. 6A is a plan view of Fig. 6 showing some of the components mounted thereon;

Figure 1:
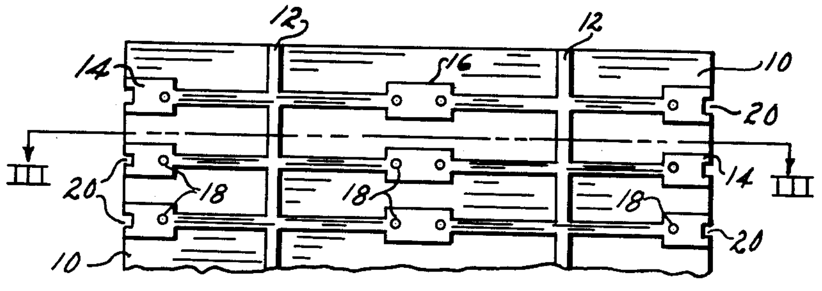
Figures 1 and 2 are plan views of preferred embodiments of this invention.

A strip of Bakelite, or other suitable insulation, 10, preferably 2¼ inches wide and 3/32 inch thick, but of any convenient width and thickness and any suitable lenth, is provided with a grid or pattern of thin copper filaments or connectors 12 which are enlarged at the top and bottom edges and at the center of the Bakelite strip to form connection points, 14 and 16, for convenient mounting of conventional commercial resistors, capacitors or other electronic components. In these connection points 14 and 16 are provided holes or slots 18 and 20, respectively, to accommodate the leads, or "pigtails" of components. On the opposite side of the Bakelite strip 10 is provided an identical pattern or grid 12′ of copper connectors with identical connection points 14′ and 16′ and utilizing the same holes and slots 18 and 20. The connecting grids 12 and 12′ on opposite sides are insulated from one another but may be connected electrically by running a wire lead through a hole 18 or slot 20 and soldering to connectors on each side of Bakelite strip 10.

Figure 2:
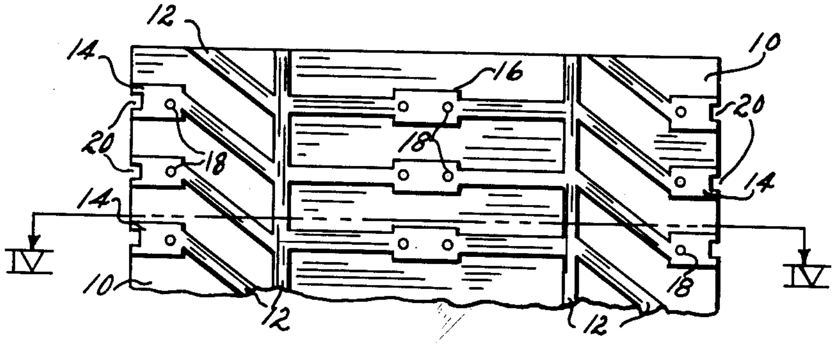
Figure 3:
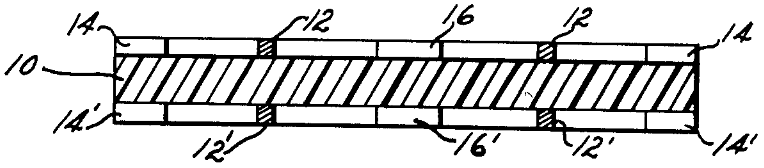
Figure 3 is a sectional view taken along the line III—III of Figure 1.
Figure 4:
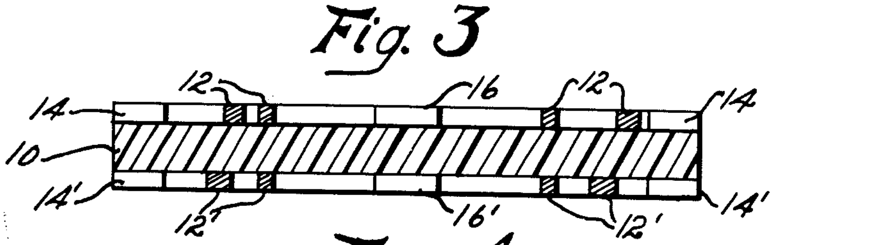
Figure 4 is a sectional view taken along the line IV—IV of Figure 2.

Figure 1 is one form of this invention wherein the connectors form a simple pattern of rectangles. Figure 2 is another form wherein the connectors form a pattern of rhomboids and rectangles so that more complicated electronic circuits may be accommodated.

In this preferred form the distances between connecting points is such as to accommodate conventional industrial components, such as ¼ watt, ½ watt, 1 watt and 2 watt carbon resistors of standard manufacture, standard capacitors of various values and small radio frequency inductors and chokes.

To use this means and method of mounting and connecting electronic components it is merely necessary to place the components, such as resistors and capacitors, one after another as the schematic circuit is read, bend the leads in place and then cut the copper connectors or filaments not needed so that the parts are in conformance with the circuit. The "pigtails" are then soldered in place, leads are soldered on and the circuit components changed or rearranged until the performance of the circuit is satisfactory. In subsequent use in laboratory or commercial apparatus the connectors are cut in conformance with the laboratory prototype before the placing of components after which it is merely necessary to solder the parts and the necessary leads and place the unit in the apparatus.

Figure 5:
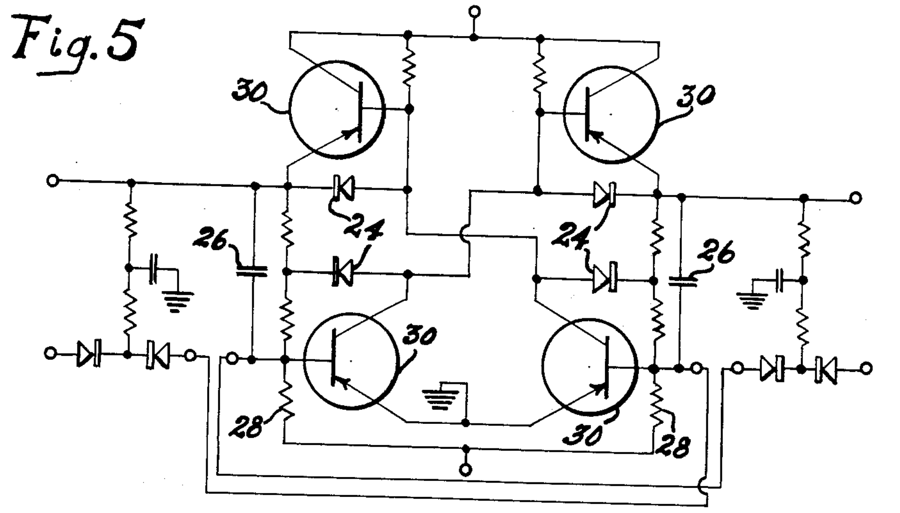
Fig. 5 is a schematic diagram of a standard multivibrator or "flip flop" circuit.

Figs. 5, 6, 6A, 7 and 8 illustrate one example of how components are mounted on the board. Referring to Fig. 5, diodes used in the circuit are numbered 24, condensers 26, resistors 28 and transistors 30.

Figures 6, 7, 8:
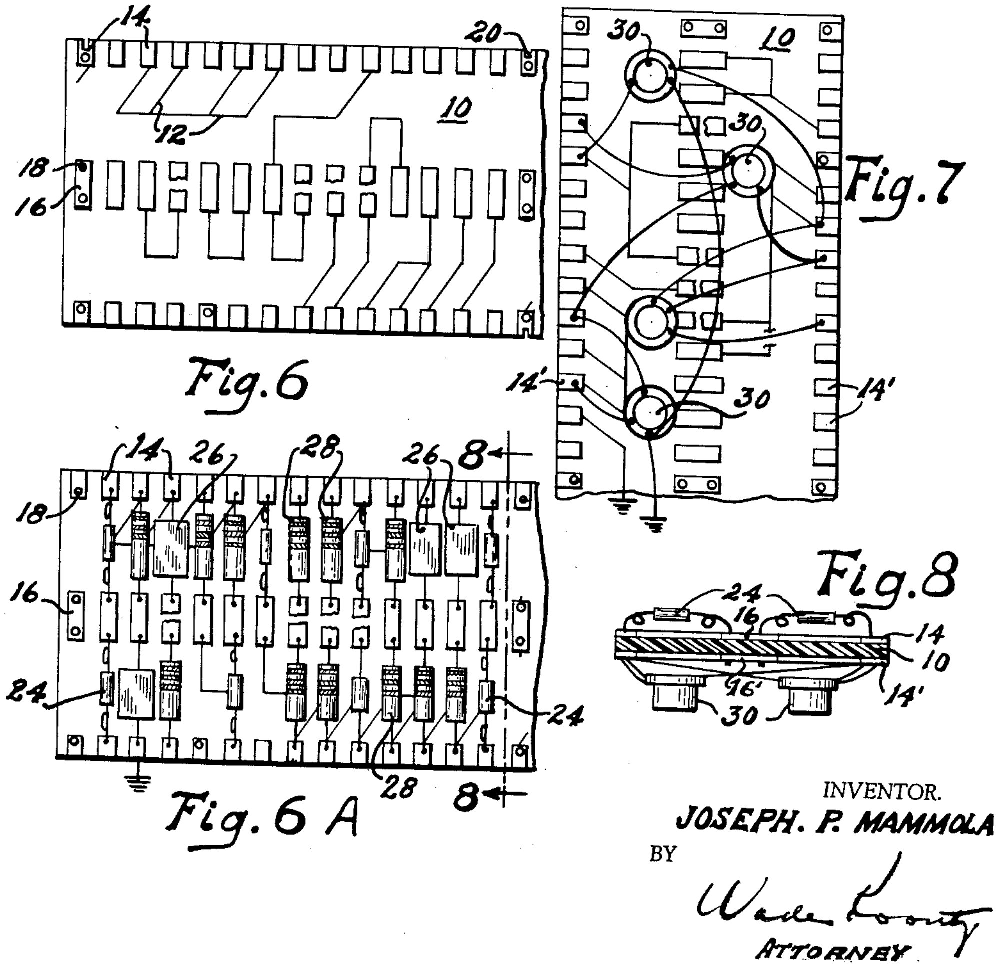
Fig. 6 is a view of the top side of the board shown in Fig. 2 with the connecting filaments cut in conformance with the circuit of Fig. 5.
Fig. 7 is a plan view of the bottom side of Fig. 6A showing transistors mounted thereon.
Fig. 8 is a sectional view of Fig. 6A taken along line 8—8.

The top view of the board of Fig. 6 has conductors removed to conform with the connections of the circuit of Fig. 5. Figures 6A, 7 and 8 illustrate the mounting of the components of Fig. 5 on the board 10.

Although the invention has been described with reference to a particular embodiment, it will be understood by those skilled in the art that the invention is capable of a variety of alternative embodiments within the spirit and scope of the appended claims.

What I claim is:

1. A terminal board of insulating material on which electronic components may be mounted, said board comprising an insulated base member, at least two spaced connectors of electrically conductive material arranged longitudinally on said base member, a plurality of other connectors of electrically conductive material arranged transversely of said base member in a symmetrical geometric pattern, said other connectors joining the longitudinal connectors and extending therebeyond to the edges of said base member, said connectors having spaced openings in which leads of electronic components may be secured, said openings being aligned with holes in said base member, and slots through said board and said other connectors at the edges of said board.

2. A terminal board as defined in claim 1 wherein the transverse connectors form right angles at all points of which they intersect the longitudinal connectors.

3. A terminal board as defined in claim 1 wherein the transverse connectors form right angle junctions at such intersections with the longitudinal connectors as lie between adjacent longitudinal connectors and form acute angle junctions at intersections from which transverse connectors extend to the edges of said base member.

4. A terminal board as defined in claim 1 wherein the arrangement of transverse and longitudinal connectors is duplicated on both faces of the base member, whereby electronic components may be secured on opposite faces of said member and still be electrically connected to each other.

References Cited in the file of this patent

UNITED STATES PATENTS

| | | |
|---|---|---|
| 1,794,831 | Caruso | Mar. 3, 1931 |
| 2,244,009 | Hiensch | June 3, 1941 |
| 2,433,384 | McLarn | Dec. 30, 1947 |
| 2,512,162 | Lips | June 20, 1950 |
| 2,524,939 | Stephan | Oct. 10, 1950 |
| 2,599,710 | Hathway | June 10, 1952 |
| 2,607,821 | Arsdell | Aug. 19, 1952 |
| 2,613,252 | Heibel | Oct. 7, 1952 |
| 2,734,150 | Beck | Feb. 7, 1956 |
| 2,777,193 | Albright | Jan. 15, 1957 |
| 2,883,447 | Dahl | Apr. 21, 1959 |
| 2,926,340 | Blain | Feb. 23, 1960 |